(12) United States Patent
Yang et al.

(10) Patent No.: US 10,877,370 B2
(45) Date of Patent: Dec. 29, 2020

(54) STRETCHABLE LAYOUT DESIGN FOR EUV DEFECT MITIGATION

(71) Applicant: Taiwan Semiconductor Manufacturing Co., Ltd., Hsin-Chu (TW)

(72) Inventors: Hsing-Lin Yang, Hsinchu (TW);
Chin-Chang Hsu, Banqiao (TW);
Yen-Hung Lin, Hsinchu (TW);
Chung-Hsing Wang, Hsinchu (TW);
Wen-Ju Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/882,235

(22) Filed: Jan. 29, 2018

(65) Prior Publication Data
US 2019/0033707 A1 Jan. 31, 2019

Related U.S. Application Data

(60) Provisional application No. 62/539,105, filed on Jul. 31, 2017.

(51) Int. Cl.
*G03F 1/72* (2012.01)
*G03F 1/84* (2012.01)
(Continued)

(52) U.S. Cl.
CPC .............. *G03F 1/72* (2013.01); *G03F 1/144* (2013.01); *G03F 1/22* (2013.01); *G03F 1/84* (2013.01); *G03F 7/2004* (2013.01); *G03F 7/7065* (2013.01); *G06F 30/3312* (2020.01); *G06F 30/398* (2020.01)

(58) Field of Classification Search
CPC ... G03F 1/144; G03F 1/70; G03F 1/22; G03F 1/72; G03F 1/84; G03F 7/2004; G03F 7/7065; G06F 17/5031; G06F 17/5081; G06F 30/398; G06F 30/3312
See application file for complete search history.

(56) References Cited

U.S. PATENT DOCUMENTS 5,509,125 A * 4/1996 Johnson ................ G06F 13/374
710/119
5,706,452 A * 1/1998 Ivanov ................. G06Q 10/107
715/751
(Continued)

*Primary Examiner* — Helen Rossoshek
(74) *Attorney, Agent, or Firm* — Duane Morris LLP

(57) ABSTRACT

A method for mitigating extreme ultraviolet (EUV) mask defects is disclosed. The method includes the steps of providing a wafer blank, identifying a first plurality of defects on the wafer blank, providing an EUV mask design on top of the wafer blank, identifying non-critical blocks with corresponding stretchable zones on the EUV mask design, overlapping the EUV blank with the EUV mask design, identifying a second plurality of defects, the second plurality of defects are solved, identifying a third plurality of defects, the third plurality of defects are not solved, adjusting the relative locations of the EUV mask design and the EUV blank to solve at least one of the third plurality of defects, and adjusting the locations of at least one of the non-critical blocks within corresponding stretchable zones to solve at least one of the third plurality of defects.

20 Claims, 12 Drawing Sheets

(51) Int. Cl.
  *G03F 7/20* (2006.01)
  *G03F 1/00* (2012.01)
  *G03F 1/22* (2012.01)
  *G06F 30/398* (2020.01)
  *G06F 30/3312* (2020.01)

(56) References Cited

U.S. PATENT DOCUMENTS

| | | | | |
|---|---|---|---|---|
| 6,385,758 B1* | 5/2002 | Kikuchi | | G06F 30/398 716/122 |
| 6,526,555 B1* | 2/2003 | Teig | | G06F 30/398 716/122 |
| 7,142,354 B2* | 11/2006 | Kojima | | G02F 1/3501 359/326 |
| 7,194,715 B2* | 3/2007 | Charlebois | | G06F 17/5031 716/106 |
| 7,302,672 B2* | 11/2007 | Pack | | G03F 1/36 430/5 |
| 7,886,244 B2* | 2/2011 | Gass | | G06F 17/5031 703/13 |
| 7,949,972 B2* | 5/2011 | Malley | | G06F 17/505 716/104 |
| 8,204,297 B1* | 6/2012 | Xiong | | G01N 21/956 356/237.4 |
| 8,488,866 B2* | 7/2013 | Terasawa | | B82Y 10/00 382/141 |
| 8,599,369 B2* | 12/2013 | Urano | | G01N 21/9501 356/237.2 |
| 8,711,346 B2* | 4/2014 | Stokowski | | B82Y 10/00 356/237.2 |
| 9,041,903 B2* | 5/2015 | Nelson | | G03F 1/84 355/30 |
| 9,377,414 B2* | 6/2016 | Chuang | | G01N 21/956 |
| 10,338,482 B2* | 7/2019 | Shibazaki | | |
| 10,339,241 B1* | 7/2019 | Iyer | | G06F 17/505 |
| 2007/0148558 A1* | 6/2007 | Akbar | | G03F 7/70283 430/5 |
| 2008/0094592 A1* | 4/2008 | Shibazaki | | G03F 7/70725 355/53 |
| 2015/0117754 A1* | 4/2015 | Nasser-Ghodsi | | G06T 7/001 382/141 |
| 2016/0299430 A1* | 10/2016 | Domon | | G03F 7/0045 |
| 2017/0281102 A1* | 10/2017 | Ken | | A61B 6/4258 |

* cited by examiner

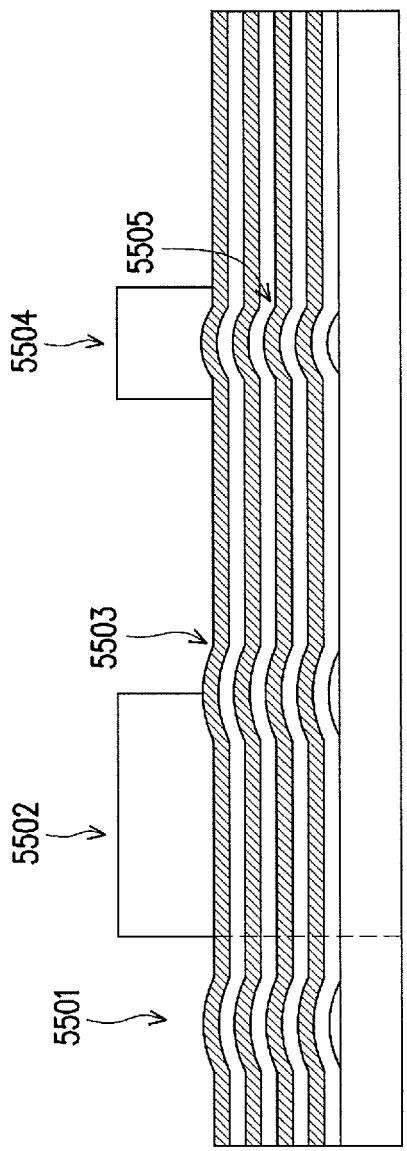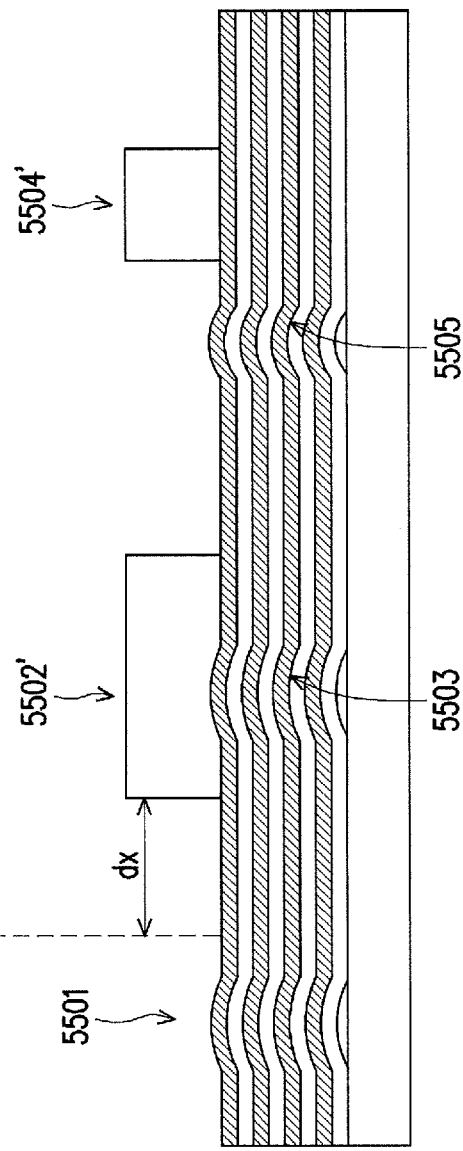
FIG. 5B(a)
FIG. 5B(b)

STRETCHABLE LAYOUT DESIGN FOR EUV DEFECT MITIGATION

CROSS-REFERENCE TO RELATED APPLICATION

The present application claims priority to U.S. Provisional Patent Application No. 62/539,105, filed on Jul. 31, 2017, which is incorporated by reference herein in its entirety.

BACKGROUND

Extreme ultraviolet ("EUV") lithography is a next-generation lithography technology implementing an extreme ultraviolet wavelength (13.5 nm). EUV lithography faces specific defect issues analogous to those being encountered by immersion lithography. Whereas the immersion-specific defects are due to un-optimized contact between the water and the photoresist, EUV-related defects are attributed to the inherently ionizing energy of EUV radiation. One issue is positive charging, due to ejection of photoelectrons freed from the top resist surface by the EUV radiation. This could lead to electrostatic discharge or particle contamination as well as the device damage mentioned above. A second issue is contamination deposition on the resist from ambient or outgassed hydrocarbons, which results from EUV or electron-driven reactions. A third issue is etching of the resist by oxygen, argon or other ambient gases, which have been dissociated by the EUV radiation or the electrons generated by EUV. Ambient gases in the lithography chamber may be used for purging and contamination reduction. These gases are ionized by EUV radiation, leading to plasma generation in the vicinity of exposed surfaces, resulting in damage to the multilayer optics and inadvertent exposure of the sample.

While source power is a significant concern due to its impact on productivity, changes in EUV mask infrastructure, including blanks, pellicles and inspection, are also important factors. Particle contamination would be prohibitive if pellicles were not stable above the targeted power for manufacturing. Without pellicles, particle adders would reduce yield, which has not been an issue for conventional optical lithography with 193 nm light and pellicles.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5B(a) and 5B(b) are illustrations of an effect of moving absorbers relative to the defects, in accordance with some embodiments.

DETAILED DESCRIPTION OF EXEMPLARY EMBODIMENTS

Figure 1:
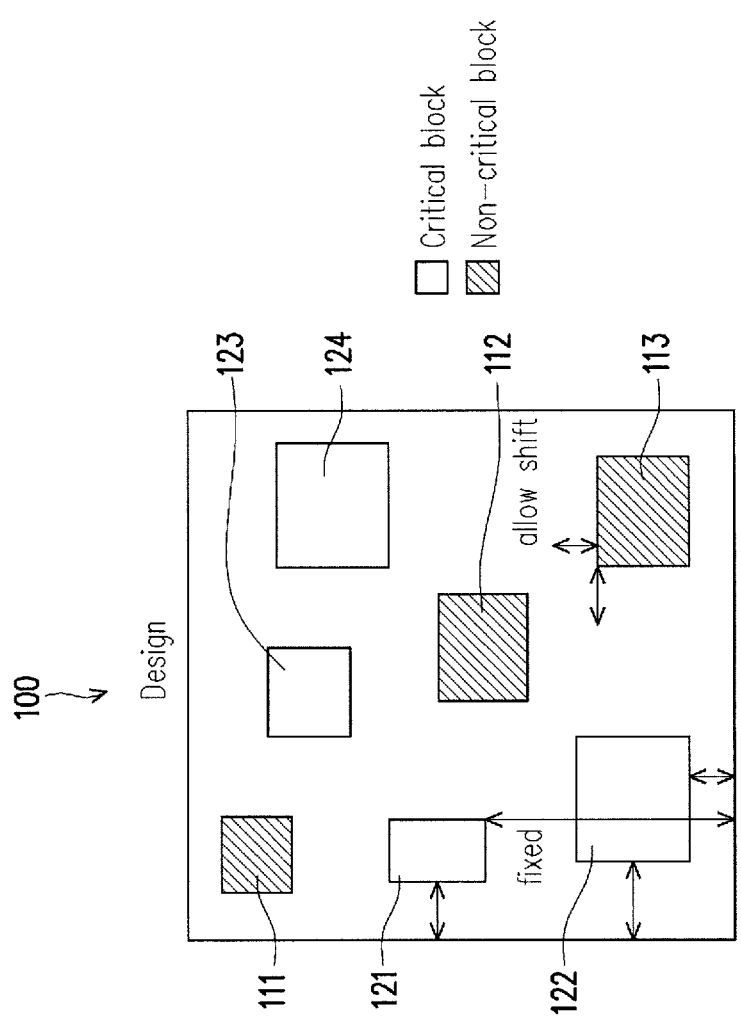
FIG. 1 is a block diagram showing some timing critical blocks and timing non-critical blocks in a design, in accordance with some embodiments.

The following disclosure provides exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram showing some timing critical blocks and timing non-critical blocks in a design 100, in accordance with some embodiments. According to some embodiments, the design 100 includes timing critical blocks 121, 122, 123 and 124 whose locations cannot be modified. When more transistors are fit into the same area using smaller process nodes, designs tend to be much larger and more power-hungry. Due to the fact that wires are becoming longer and thinner, wire delays have a significant effect on a design's timing characteristics. The timing critical blocks are those blocks whose locations have critical effect on the timing characteristics of the design. As a comparison, the timing non-critical blocks are those blocks whose locations do not have critical effects on the timing characteristics of the design.

According to some embodiments, the design also includes a plurality of timing non-critical blocks 111, 112 and 113 whose locations can be modified to a certain extent, such modifications can be either in the horizontal direction, or the in the vertical direction. As stated above, the locations of the non-critical blocks do not have a critical effect on the timing characteristics of the design. As a result, the locations of the timing non-critical blocks can be adjusted within certain ranges without substantially affecting the overall timing characteristics of the design. More details of such modifications will be discussed in the following paragraphs.

Figure 2A:
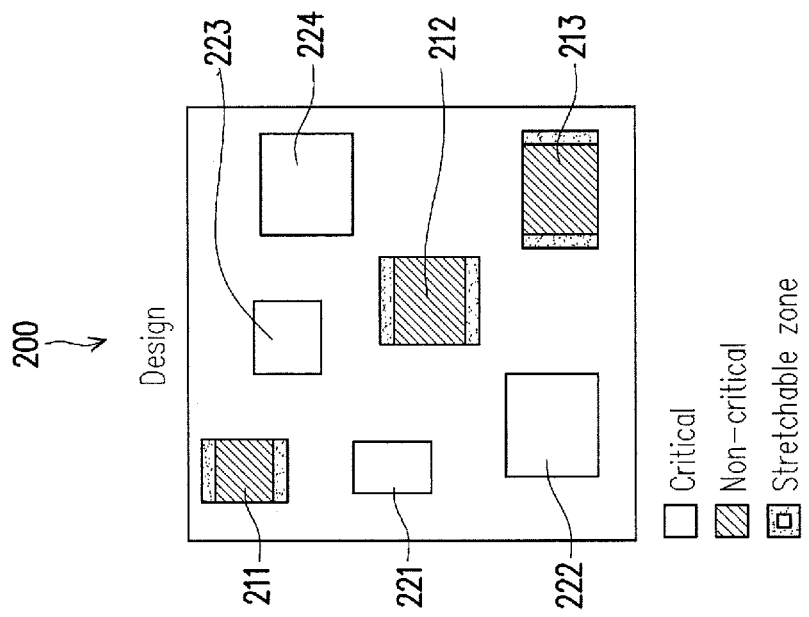
FIG. 2A is an illustration of a layout design with a one dimensional placement flexibility, in accordance with some embodiments.

FIG. 2A is an illustration of a layout design with a one dimensional placement flexibility, in accordance with some embodiments. According to some embodiments, the design 200 includes timing critical blocks 221, 222, 223 and 224 whose locations cannot be modified without affecting the timing characteristics of the design 200. The design 200 also includes timing non-critical blocks 211, 212 and 213 whose location can be modified to a certain extent, either in the horizontal direction or in the vertical direction without significantly affecting the timing characteristics of the design 200. As shown in FIG. 2A, blocks 211, 212, 213, 251 and 261 are timing non-critical blocks whose locations can be shifted within a certain range in the x direction or the y direction, or a combination of x and y directions. The timing non-critical blocks 251 and 261 are enlarged exemplary views of the blocks 211, 212 and 213.

Figure 2B:
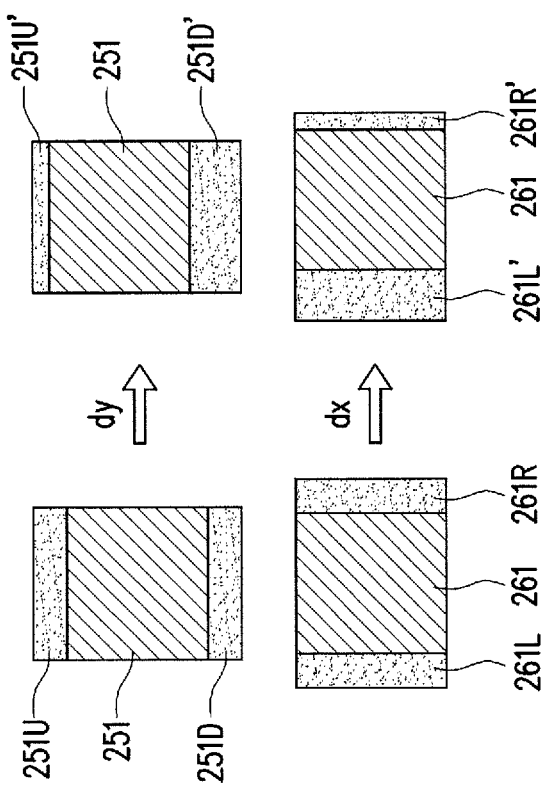
FIG. 2B is an illustration of the one dimensional placement flexibility corresponding to FIG. 2A, in accordance with some embodiments.

FIG. 2B is an illustration of the one dimensional placement flexibility corresponding to FIG. 2A, in accordance with some embodiments. As shown in FIG. 2B, the timing non-critical block 251 includes stretchable zone 251U, which is located on the upper side of the timing non-critical block 251, and stretchable zone 251D, which is located on the lower side of the timing non-critical block 251. As used herein, the term "stretchable zone" refers to an area in the neighborhood of a timing non-critical block, and the timing non-critical block can be shifted within the stretchable zone without affecting the timing characters of the overall circuit design. According to some embodiments, the stretchable zone is located on the left and/or right of the timing non-critical block. According to some embodiments, the stretchable zone is located on the top and/or bottom of the timing non-critical block. When the timing non-critical block 251 is shifted upward within the stretchable zone 251U, a routing metal strip is compensated on the opposite side 251D and the area of the timing non-critical block 251 is maintained. According to some embodiments, a routing metal strip is a metal wire which is compensated by reducing the length at one end and increasing the length at the other end so that the timing non-critical block is shifted and the total length of the routing metal strip is not changed. After the shift, the stretchable zones 251U and 251D become 251U' and 251D', respectively. Similarly, the timing non-critical block 261 is shifted horizontally, and the stretchable zones 261L and 261R become 261L' and 261R', respectively. According to some embodiments, whether the timing non-critical block is shifted in the horizontal direction or the vertical direction is determined by the pin characteristics of the design, which will be discussed in further detail below.

Figure 3A:
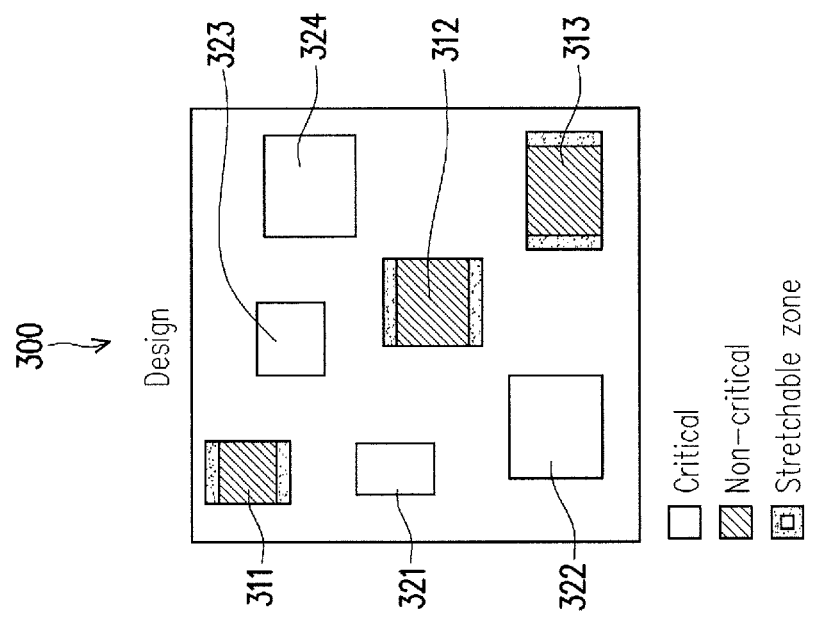
FIG. 3A is an illustration of another layout design with a one dimensional placement flexibility, in accordance with some embodiments.
Figure 3B:
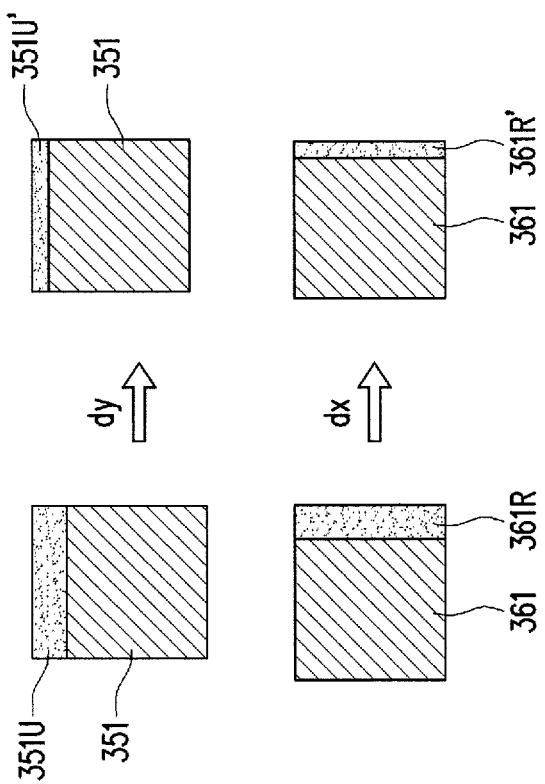
FIG. 3B is an illustration of the one dimensional placement flexibility corresponding to FIG. 3A, in accordance with some embodiments.

FIG. 3A is an illustration of another layout design with a one dimensional placement flexibility, in accordance with some embodiments. FIG. 3B is an illustration of the one dimensional placement flexibility corresponding to FIG. 3A, in accordance with some embodiments. As shown in FIG. 3A and FIG. 3B, the design 300 is a design similar to the design 200 and the difference is that the stretchable zone 351U of the timing non-critical block 351 is only located on one side of the timing non-critical block 351. As a result, the timing non-critical block 351 can only be shifted upward, and the stretchable zone 351U becomes 351U' after the shift. Similarly, the timing non-critical block 361 can only be shifted to the right, and the stretchable zone 361R becomes 361R' after the shift. According to some embodiments, the timing non-critical block can be shifted as a combination of x direction shift and y direction shift.

Figure 4A:
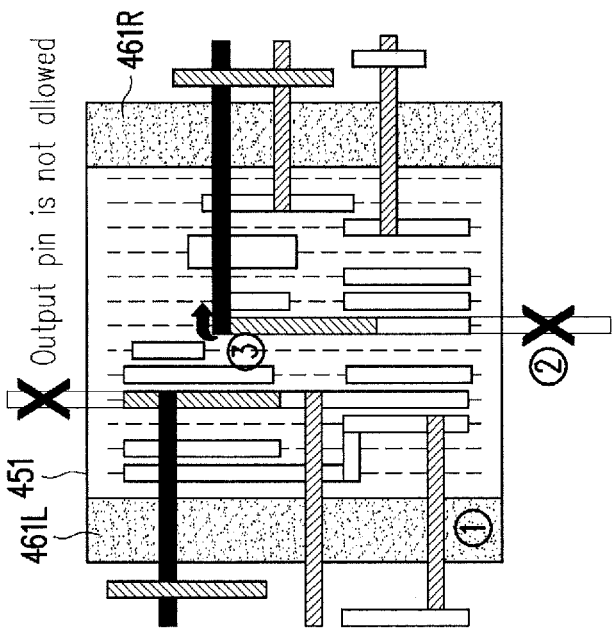
FIG. 4A is a layout illustration of an exemplary internal structure of a timing non-critical block with stretchable layout design, in accordance with some embodiments.

FIG. 4A illustrates a layout diagram of an exemplary internal structure of a timing non-critical block with stretchable layout design, in accordance with some embodiments. According to some embodiments, the block 451 is an embodiment of the timing non-critical block 251 as illustrated in FIG. 2A and FIG. 2B, and 451U and 451D are upper and lower stretchable zones similar to 251U and 251D corresponding to the block 251 as illustrated in FIG. 2A and FIG. 2B. The metal layers inside the block 451 are illustrated as strips, in this embodiment, metals in the same layer are illustrated with the same pattern and metals in different layers are illustrated with different patterns. According to some embodiments, the M2 layer strips are all horizontal and the next layer strips above it, M3, are all vertical. Similarly, the next layer strips above M3 are M4 strips, which are all horizontal, in the next layer, M5 strips are all vertical, and in the next metal layer, M6 strips are all horizontal again, etc. According to some embodiments, the lowest layer has the largest number of strips; as a result, the lowest layered strips determine the shift direction. According to some embodiments, the M2 strips inside the timing non-critical block 451 determines that the timing non-critical block 451 can only be shifted in the vertical direction, and within the zones 451U and 451D. As a result, the horizontal metal routings 451R1 and 451R2 outside the non-critical block 451 are forbidden when the block is shifted vertically because otherwise they will become misrouted. According to some embodiments, the length of the corresponding vertical strips, for example 451V, are adjusted appropriately to fit with the shifted horizontal strips so that the vertical strips are kept inside the timing non-critical block 451.

Figure 4B:
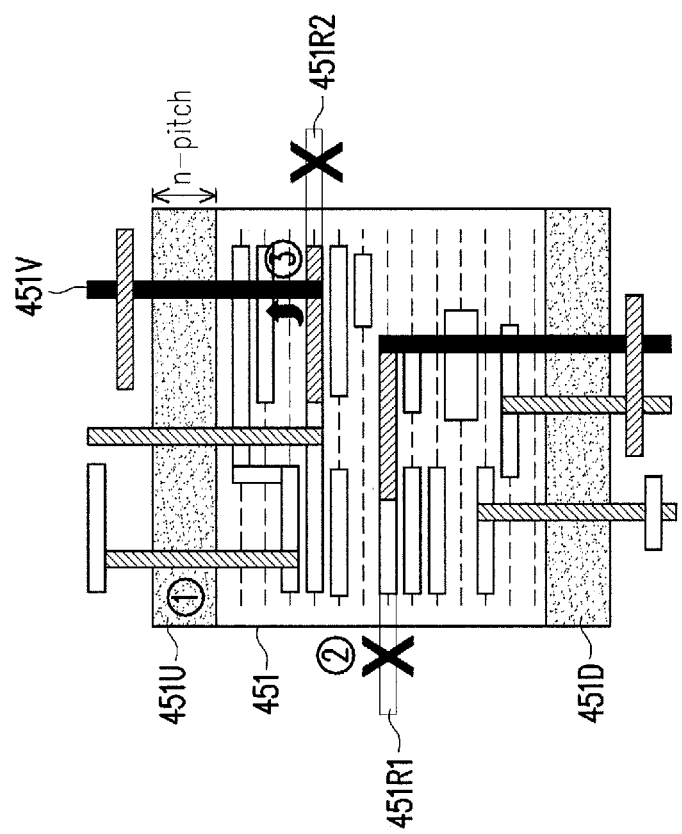
FIG. 4B is a layout illustration of another exemplary internal structure of a timing non-critical block with stretchable layout design, in accordance with some embodiments.

FIG. 4B is a layout illustration of another exemplary internal structure of a timing non-critical block with stretchable layout design, in accordance with some embodiments. According to some embodiments, the discussion of timing non-critical block 461 and its corresponding stretchable zones 461L and 461R in FIG. 4B are similar to the discussion in the previous paragraph, except that the shift direction is now horizontal instead of vertical, and all other corresponding directions are rotated 90 degrees.

Figure 5A:
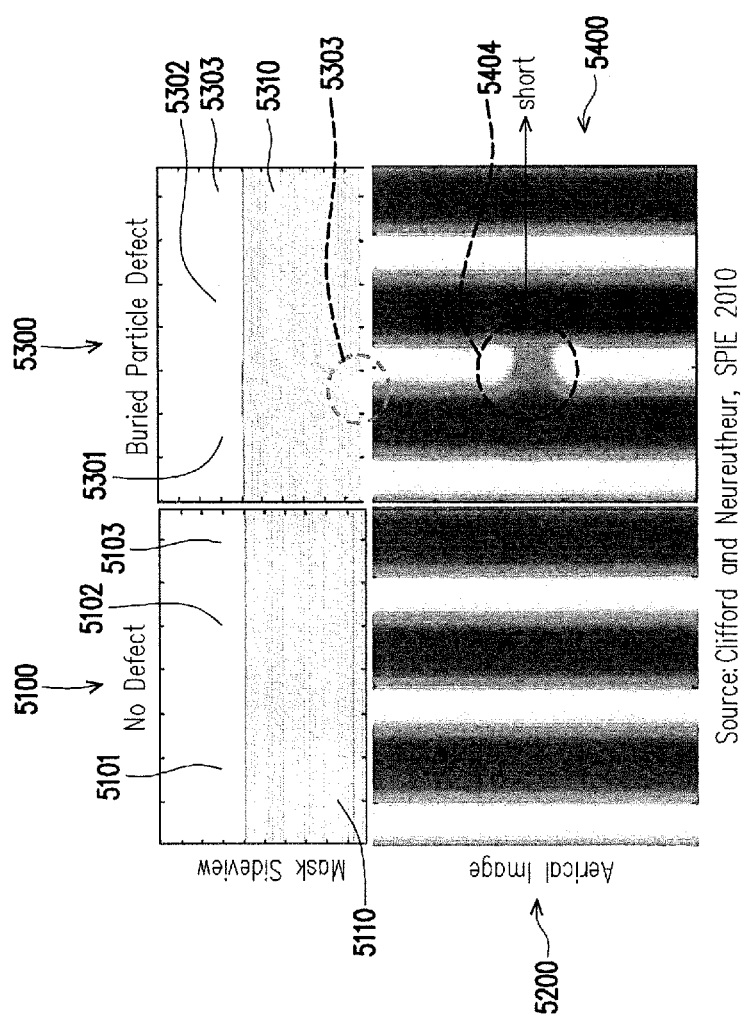
FIG. 5A is an image showing formation of a defect, in accordance with some embodiments.

FIG. 5A is an illustration of the formation of a defect, in accordance with some embodiments. According to some embodiments, the mask side view 5100 includes a plurality of design patterns 5101, 5102 and 5103 disposed on top of a wafer blank 5110 without defects. When the EUV light is shed on the mask 5100 without defects, an aerial image 5200 is obtained which exhibits no shorting or distortions caused by defects. In comparison, the design patterns 5301, 5302 and 5303 of the mask 5300 disposed on top of a wafer blank 5310 with a defect 5304. A defect is, for example, a pit or a particle on the substrate surface. When the EUV light is shed on the mask 5200, because the defect 5304 is located on the boundary of the pattern 5301, the boundary features 5304 of the aerial image 5400 is damaged, causing broken wire or shorting problems. According to some embodiments, for example, a defect of 3.5 nm tall can cause a 20 nm critical dimension change. According to some embodiments, the relative locations of the design patterns 5301-5303 and the blank 5310 can be shifted so that the defect 5304 is no longer situated on the boundary of the pattern 5301, or any other patterns. According to some embodiments, when the defect 5304 is no longer situated on the boundaries of any pattern, the defect can be situated either directly under a pattern and entirely covered by that pattern, or not under any pattern, as discussed in further detail below with respect to FIG. 5B.

FIG. 5B illustrates an effect of moving absorbers relative to the defects, in accordance with some embodiments. According to some embodiments, the wafer blank includes defects 5501, 5502 and 5503. And on the top of the blank, the design includes patterns, which are also called absorbers in this context, 5502 and 5504. According to some embodiments, the absorbers are mask pattern 5500 in the design which absorbs the incoming EUV light in the etching process. The defect 5503 is located on the edge of the absorber 5502. As discussed earlier, such a defect 5503 on the edge of an absorber can cause broken wires and/or shorting problems. In comparison, the defect 5501 is not located under any absorber, as a result, the defect 5501 will not cause any problems and 5501 is called a "solved" defect. Also in comparison, the defect 5505 is directly under 5504 and is covered entirely by the absorber 5504 and as a result will not cause any edge problems like defect 5503. The defect 5505 is also called a "solved" defect.

According to some embodiments, in order to eliminate (or "solve") the problems caused by the defect 5503, the absorber 5502 needs to be moved so that the defect 5503 is no longer located on the edge of the absorber 5502. There are two possible scenarios to move the absorber 5502 to solve the defect 5503, either by moving the absorber 5502 to entirely cover the defect 5503, or by moving the absorber 5502 completely away from the defect 5503. The scenario illustrated in FIG. 5B is absorber 5502', which is shifted by an amount of dx to completely cover the defect 5503 to solve defect 5503. According to some embodiments, the shift in dx is a global shift which means that the entire blank is shifted relative to the mask design and every absorber is shifted by the same amount dx in the same direction. As a result, the absorber 5504 is shifted to become absorber 5504', which is moved away from the defect 5505 completely. Because the defect 5505 is not on the edge of any absorbers, the defect remains solved. According to some embodiments, instead of a global shift dx illustrated in FIG. 5B, a local shift solves the defects as well. For example, the absorber 5502 is shifted to 5502', while the absorber 5504 remains in place, and thus both defects 5503 and 5505 are solved.

According to some embodiments, the global shift is in the horizontal direction. According to some embodiments, the global shift is in the vertical direction. According to some embodiments, the global shift is an angular shift. According to some embodiments, the local shift can be a linear shift in other direction, and the local shift can also be an angular shift in the surface plane of the blank.

Figure 5C:
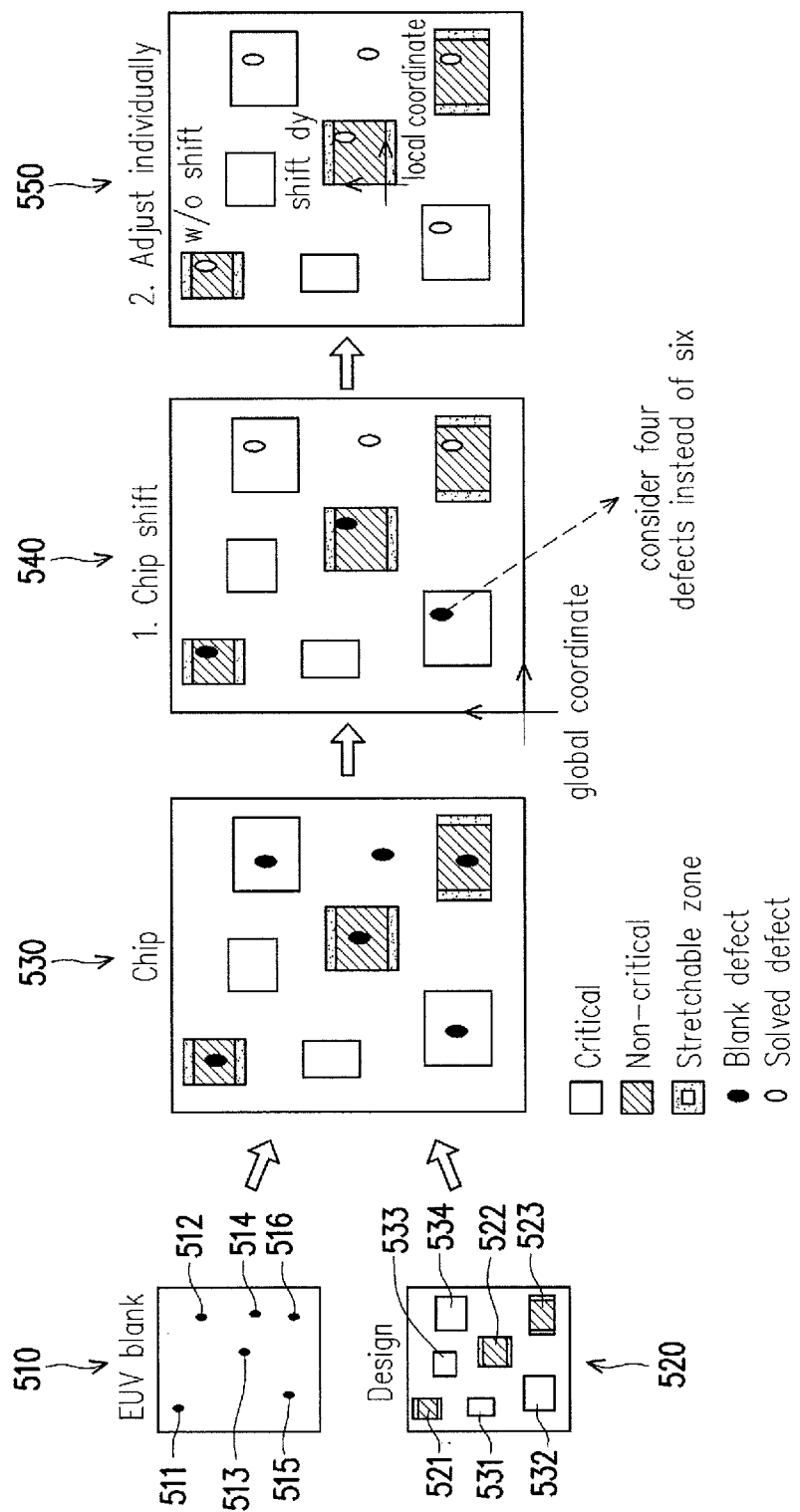
FIG. 5C is an illustration of a defect mitigation procedure, in accordance with some embodiments.

FIG. 5C is an illustration of a defect mitigation procedure, in accordance with some embodiments. According to some embodiments, the wafer blank 510 includes a plurality of blank defects 511, 512, 513, 514, 515 and 516. And the design 520 includes a plurality of timing critical blocks 531, 532, 533 and 534 whose locations cannot be modified without affecting the timing characteristics of the design, as discussed earlier. The design 520 also includes a plurality of timing non-critical block 521, 522 and 523 with stretchable zones that can be shifted vertically or horizontally. As discussed earlier, the locations of the timing non-critical blocks can be shifted without affecting the timing characteristics of the design.

According to some embodiments, 530 is the initial overlap of the wafer blank 510 and the design 520. The blank defect 514 is not under any blocks thus not on any feature boundaries, so the defect 514 becomes a solved defect automatically. According to some embodiments, the entire design 520 is shifted globally relative to the wafer blank 510. The global shift can include a horizontal shift, a vertical shift and/or an angular shift, in accordance with various embodiments. According to some embodiments, after a global shift, defects 515, 516 and 512 also become solved defects because they are shifted away from feature boundaries. According to some embodiments, defects 511 and 513 under corresponding non-critical blocks 521 and 522 remain un-solved defects after the global shift. In order to solve the remaining defects 511 and 513, non-critical blocks 521 is shifted vertically to solve the defect 511, and the non-critical block 522 is also shifted vertically to solve the defect 513. According to some embodiments, the shifting of non-critical blocks 521 and 522 are of different amounts in accordance with local shifts. According to some embodiments, the shifting of non-critical blocks 521 and 522 are of different directions. According to some embodiments, in the properly shifted blank and design, all defects become solved defects. As a result, a blank with defects can now be used to produce products without affecting the quality, so the overall yield of devices formed from the blanks is increased.

Figures 6A, 6B:
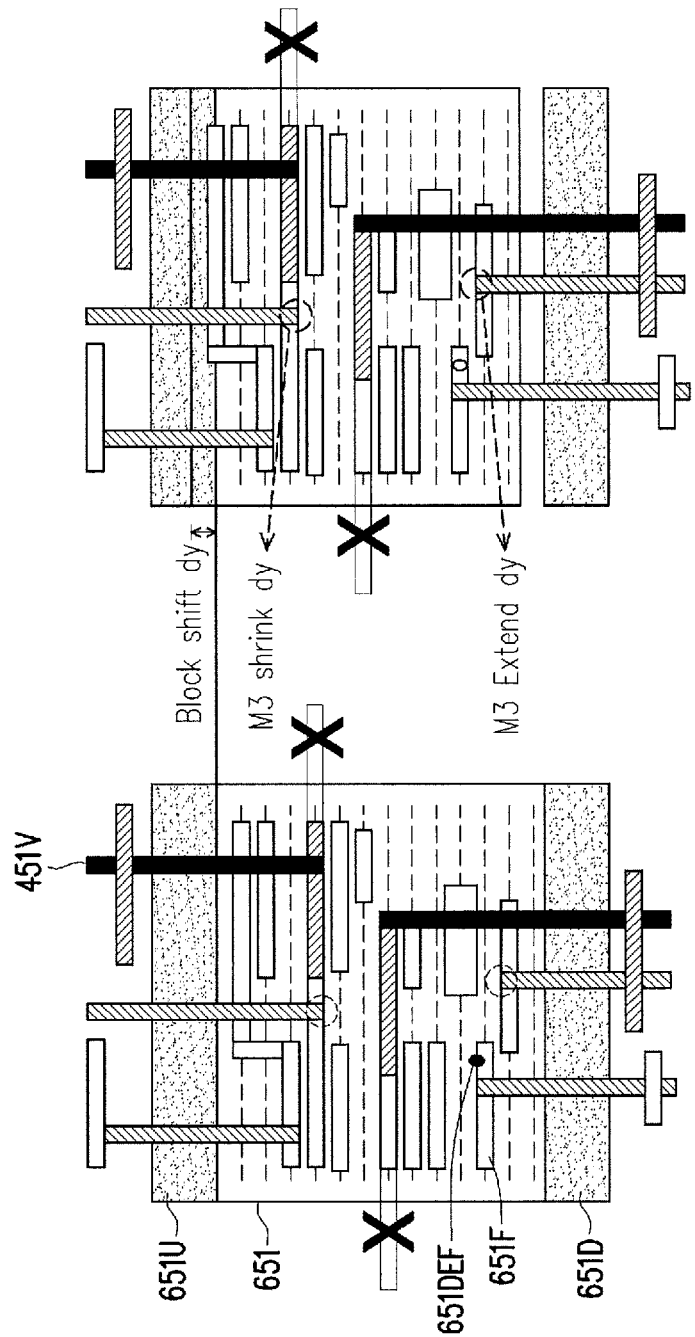
FIG. 6A is a layout illustration of an exemplary internal structure of a timing non-critical block with stretchable layout design, in accordance with some embodiments.
FIG. 6B is a layout illustration of another exemplary internal structure of a timing non-critical block with stretchable layout design, in accordance with some embodiments.

FIG. 6A is a layout illustration of an exemplary internal structure of a timing non-critical block with stretchable layout design, in accordance with some embodiments. FIG. 6B is a schematic illustration of another exemplary internal structure of a timing non-critical block with stretchable layout design, in accordance with some embodiments. Similar to the discussion of FIGS. 4A and 4B, timing non-critical block 651 can be shifted vertically, with stretchable zones 651U and 651D. According to some embodiments, a defect 651DEF is located on the boundary of a feature 651F, which for example is a horizontal M2 strip. According to some embodiments, when the non-critical block 651 is shifted upward by an amount dy, the defect 651DEF is covered by the feature 651F, and as a result, 651F becomes a solved defect. According to some embodiments, corresponding M3 strips are extended, or shrank, by an appropriate dy amount.

Figure 7:
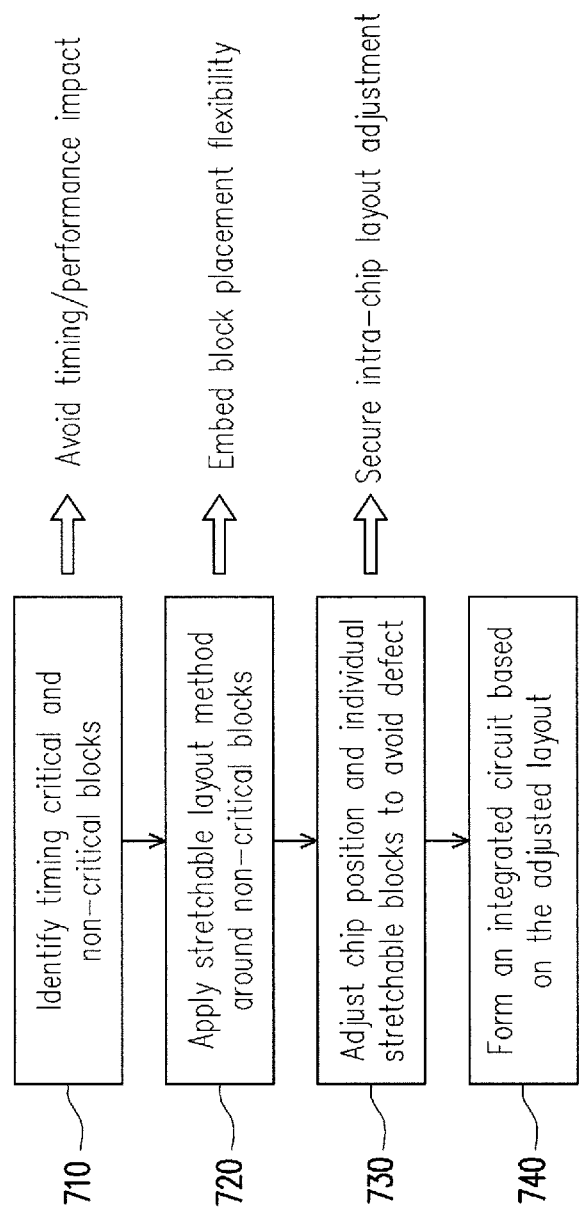
FIG. 7 is a flow chart of a stretchable layout design method, in accordance with some embodiments.

FIG. 7 is a flow chart of a stretchable layout design method, in accordance with some embodiments. At operation 710, timing critical blocks and timing non-critical blocks are identified. As explained above, the timing critical blocks cannot be shifted since doing so may have a negative impact on timing and performance. Next, at operation 720, one or more non-critical blocks are shifted or stretched in a desired direction and/or angular amount. The placement flexibility provided by non-critical blocks increases EUV blank usability while maintaining high performance of the mask design. In the next step 730, adjust chip position and individual stretchable blocks to avoid defects, then secure and fix the new positions of each block after the layout adjustment performed above. According to this design method, there is no need for an iterative modification between the foundry phase that includes operations 710, 720 and the design phase that includes operation 730. At operation 740, an integrated circuit is formed based on the adjusted layout.

Figure 8:
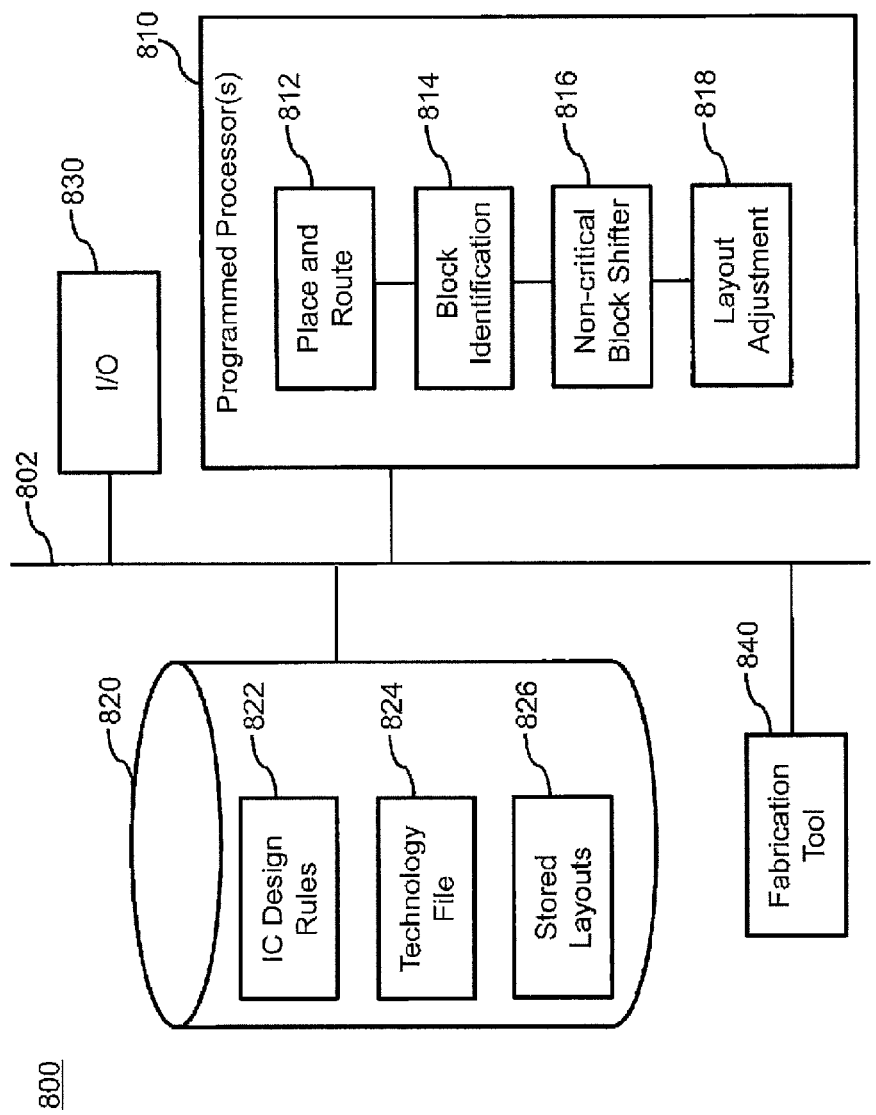
FIG. 8 is a block diagram of a system for fabricating an integrated circuit with a stretchable layout design, in accordance with some embodiments.

FIG. 8 is a block diagram of a system 800 for fabricating an integrated circuit with a stretchable layout design, in accordance with some embodiments. The system 800 includes one or more programmed processors 810. In some embodiments, the stretchable layout design is performed by two or more application programs, each operating on a separate processor. In other embodiments, the operations of the stretchable layout design are all performed using one processor. Although FIG. 8 shows an allocation of the various tasks to specific modules, this is only one example. The various tasks may be assigned to different modules to improve performance, or improve the ease of programming.

In this example, the system 800 includes an electronic design automation ("EDA") tool that may include a place and route tool 812. The EDA tool is a special purpose computer formed by retrieving stored program instructions from a non-transient computer readable storage medium 820 and executing the instructions on a general purpose processor 810. Thus, the instructions configure the logic circuits of the processors 810 to function as an EDA tool. Examples of the non-transient computer readable storage medium 820 include, but are not limited to, hard disk drives (HDD), read only memories ("ROMs"), random access memories ("RAMs"), flash memories, or the like. The tangible, non-transient machine readable storage medium 820 is configured to store data generated by the place and route tool 812. The router of the place and route tool 812 is capable of receiving a stored layout 826 from the medium 820 as a template for circuit design. Router 812 may be equipped with a set of default IC design rules 822 and technology file 824 for the stretchable layout design.

In accordance with various embodiments, the system 800 may also include a block identification module 814 configured for identifying timing critical blocks and timing non-critical blocks; a non-critical block shifter 816 configured for shifting or stretching the non-critical blocks in a desired direction and/or angular amount; and a layout adjustment module 818 configured for adjusting chip position and individual stretchable blocks to avoid defects. A newly designed layout may be stored in the non-transitory machine-readable storage medium 820. The system 800 may further include a fabrication tool 840 that can physically implement the adjusted layout into an integrated circuit.

As shown in FIG. 8, the system 800 also includes an input/output (I/O) 830 configured to receive inputs and transmit outputs to external circuits. I/O 830 is electrically connected to the one or more programmed processors 810, the memory 820, and the fabrication tool 840 via a bus 802.

According to some embodiments, a method for mitigating extreme ultraviolet (EUV) mask defects is disclosed. The method includes the steps of providing a wafer blank, identifying a first plurality of defects on the wafer blank, providing an EUV mask design on top of the wafer blank, identifying timing non-critical blocks with corresponding stretchable zones on the EUV mask design, and adjusting a location of at least one of the non-critical blocks within a corresponding stretchable zone to solve at least one of the plurality of defects. According to some embodiments, the method further includes the step of updating the EUV mask design to reflect the adjusting the location of at least one of the timing non-critical blocks. According to some embodiments, the method further includes the step of identifying a first subset of defects within the plurality of defects that are solved, identifying a second subset of defects within the plurality of defects that are not solved, the at least one of the plurality of defects solved by adjusting comprises at least one of the second subset of defects. According to some embodiments, the step of the adjusting of the locations of at least one additional timing non-critical blocks within a corresponding stretchable zone comprises adjusting the location horizontally. According to some embodiments, the step of the adjusting the location of at least one timing non-critical blocks within a corresponding stretchable zone includes adjusting the location vertically. According to some embodiments, the step of adjusting the location of at least one timing non-critical blocks within a corresponding stretchable zone includes adjusting the location angularly. According to some embodiments, the step of adjusting the location of at least one timing non-critical blocks within a corresponding stretchable zone comprises adjusting the location both vertically and horizontally. According to some embodiments, the step of adjusting the location of at least one timing non-critical blocks within a corresponding stretchable zone comprises adjusting the location both vertically and angularly. According to some embodiments, the step of adjusting the location of at least one timing non-critical blocks within a corresponding stretchable zone comprises adjusting the location both horizontally and angularly. According to some embodiments, the step of adjusting the location of at least one timing non-critical blocks within a corresponding stretchable zone comprises adjusting the location vertically and horizontally and angularly.

According to some embodiments, a method for designing stretchable layout of a timing non-critical block is disclosed. The method includes the steps of defining stretchable zones of the timing non-critical block, deploying a first plurality of metal strips of a first layer inside the timing non-critical block, identifying a second plurality of outreaching routing strips parallel to the first plurality of metal strips, wherein the outreaching routing trips reach out of the non-critical block, removing the second plurality of outreaching routing strips and replacing the second plurality of outreaching routing strips with a third plurality of strips in a direction perpendicular to the second plurality of outreaching routing strips. According to some embodiments, the step of defining the stretchable zones of the timing non-critical block defines the stretchable zones in the horizontal direction of the timing non-critical block. According to some embodiments, the step of defining the stretchable zones of the timing non-critical block defines the stretchable zones in the vertical direction of the timing non-critical block. According to some embodiments, the step of defining the stretchable zones of the timing non-critical block defines the stretchable zones in both the horizontal and the vertical direction of the timing non-critical block. According to some embodiments, the step of defining the stretchable zones of the timing non-critical block defines the stretchable zones in the angular direction of the timing non-critical block. According to some embodiments, the step of defining the stretchable zones of the timing non-critical block defines the stretchable zones in both the horizontal and the angular direction of the timing non-critical block. According to some embodiments, the step of defining the stretchable zones of the timing non-critical block defines the stretchable zones in the horizontal and the vertical and the angular direction of the timing non-critical block.

According to some embodiments, a device layout is disclosed. The device layout includes a substrate, a first plurality of blocks, wherein the first plurality of blocks is timing critical, a second plurality of blocks, wherein the second plurality of blocks are timing non-critical, the second plurality of blocks each comprises at least one stretchable zone, the location of each of the second plurality of blocks can be shifted within the corresponding stretchable zone. According to some embodiments, the at least one corresponding stretchable zone of at least one of the second plurality of blocks is located in the horizontal direction. According to some embodiments, the at least one corresponding stretchable zone of at least one of the second plurality of blocks is located in the vertical direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for mitigating extreme ultraviolet (EUV) mask defects, the method comprising the steps of:
    providing a wafer blank;
    identifying a plurality of defects on the wafer blank;
    providing an EUV mask design on top of the wafer blank;
    identifying timing non-critical blocks on the EUV mask design; and
    adjusting a location of at least one of the timing non-critical blocks, by an angular shift that is not a horizontal or vertical shift, to solve at least one of the plurality of defects.

2. The method of claim 1, further comprising the step of updating the EUV mask design to reflect the adjusting the location of at least one of the timing non-critical blocks.

3. The method of claim 1, further comprising:
    identifying a first subset of defects within the plurality of defects that are solved;
    identifying a second subset of defects within the plurality of defects that are not solved,
    wherein the at least one of the plurality of defects solved by adjusting comprises at least one of the second subset of defects.

4. The method of claim 1, further comprising adjusting the location horizontally within a corresponding stretchable zone.

5. The method of claim 1, further comprising adjusting the location vertically within a corresponding stretchable zone.

6. The method of claim 1, wherein:
    the timing non-critical blocks are identified with corresponding stretchable zones on the EUV mask design; and
    the location is adjusted angularly within a corresponding stretchable zone.

7. The method of claim 1, further comprising adjusting the location both vertically and horizontally within a corresponding stretchable zone.

8. The method of claim 1, further comprising adjusting the location both vertically and angularly within a corresponding stretchable zone.

9. The method of claim 1, further comprising adjusting the location both horizontally and angularly within a corresponding stretchable zone.

10. The method of claim 1, further comprising adjusting the location vertically and horizontally and angularly within a corresponding stretchable zone.

11. A method for mitigating extreme ultraviolet (EUV) mask defects, the method comprising the steps of:
    providing a wafer blank;
    identifying a plurality of defects on the wafer blank;
    providing an EUV mask design on top of the wafer blank;
    identifying timing non-critical blocks with corresponding stretchable zones on the EUV mask design; moving, by an angular shift that is not a horizontal or vertical shift, a location of at least one of the timing non-critical blocks within a corresponding stretchable zone; and
    moving, along at least one of a vertical direction and a horizontal direction, the location of the at least one of the timing non-critical blocks within the corresponding stretchable zone to solve at least one of the plurality of defects.

12. The method of claim 11, wherein the location of the at least one of the timing non-critical blocks is shifted both vertically and horizontally within the corresponding stretchable zone.

13. A method for mitigating extreme ultraviolet (EUV) mask defects, the method comprising the steps of:
    providing a wafer blank;
    identifying a plurality of defects on the wafer blank;
    providing an EUV mask design on top of the wafer blank;
    identifying timing non-critical blocks on the EUV mask design; and
    adjusting at least one of the timing non-critical blocks to solve at least one of the plurality of defects, wherein the adjusting comprises shifting the at least one of the timing non-critical blocks by an angular shift that is not horizontal or vertical shift.

14. The method of claim 13, wherein the adjusting further comprises shifting the at least one of the timing non-critical blocks horizontally within a corresponding stretchable zone.

15. The method of claim 13, wherein the adjusting further comprises shifting the at least one of the timing non-critical blocks vertically within a corresponding stretchable zone.

16. The method of claim 13, wherein:
    the timing non-critical blocks are identified with corresponding stretchable zones on the EUV mask design; and
    the at least one of the timing non-critical blocks is shifted angularly within a corresponding stretchable zone.

17. The method of claim 13, wherein the adjusting further comprises shifting the at least one of the timing non-critical blocks both vertically and horizontally within a corresponding stretchable zone.

18. The method of claim 13, wherein the adjusting further comprises shifting the at least one of the timing non-critical blocks both vertically and angularly within a corresponding stretchable zone.

19. The method of claim 13, wherein the adjusting further comprises shifting the at least one of the timing non-critical blocks both horizontally and angularly within a corresponding stretchable zone.

20. The method of claim 13, wherein the adjusting further comprises shifting the at least one of the timing non-critical blocks vertically and horizontally and angularly within a corresponding stretchable zone.

* * * * *